(12) United States Patent
Nishida et al.

(10) Patent No.: US 10,530,322 B2
(45) Date of Patent: Jan. 7, 2020

(54) RESONANT CIRCUIT, BAND ELIMINATION FILTER, AND BAND PASS FILTER

(71) Applicant: Murata Manufacturing Co., Ltd., Nagaokakyo-shi, Kyoto-fu (JP)

(72) Inventors: Hiroshi Nishida, Nagaokakyo (JP); Kenichi Ishizuka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 48 days.

(21) Appl. No.: 15/726,477

(22) Filed: Oct. 6, 2017

(65) Prior Publication Data

US 2018/0041182 A1 Feb. 8, 2018

Related U.S. Application Data

(63) Continuation of application No. PCT/JP2016/061348, filed on Apr. 7, 2016.

(30) Foreign Application Priority Data

Apr. 17, 2015 (JP) .................. 2015-085166

(51) Int. Cl.
*H03H 7/09* (2006.01)
*H03H 7/01* (2006.01)
*H01F 27/00* (2006.01)
*H03H 7/12* (2006.01)
*H03H 9/02* (2006.01)
(Continued)

(52) U.S. Cl.
CPC ............... *H03H 7/09* (2013.01); *H01F 27/00* (2013.01); *H03H 7/0115* (2013.01); *H03H 7/12* (2013.01); *H03H 7/175* (2013.01); *H03H 7/1758* (2013.01); *H03H 7/1783* (2013.01); *H03H 7/1791* (2013.01); *H03H 9/02* (2013.01);
(Continued)

(58) Field of Classification Search
CPC ......... H03H 7/0115; H03H 2001/0085; H03H 7/1783; H03H 7/1791; H03H 7/09; H03H 7/1758
USPC .................................................. 333/175, 185
See application file for complete search history.

(56) References Cited

U.S. PATENT DOCUMENTS 4,451,803 A 5/1984 Holdsworth et al.
5,621,366 A * 4/1997 Gu .......................... H01P 7/084
333/185

(Continued)

FOREIGN PATENT DOCUMENTS

JP 63-18709 A 1/1988
JP 63-179603 A 7/1988
(Continued)

OTHER PUBLICATIONS

Official Communication issued in Japanese Patent Application No. 2017-512278, dated Oct. 16, 2018.
(Continued)

Primary Examiner — Rakesh B Patel
(74) Attorney, Agent, or Firm — Keating & Bennett, LLP

(57) ABSTRACT

A resonant circuit includes a first inductor and a first capacitor which define a first series circuit and a second inductor connected in parallel to the first series circuit. The first inductor and the second inductor are coupled via a magnetic field in a direction in which magnetic fluxes passing through the inductor and the second inductor strengthen each other to effectively increase steepness in a transient band.

12 Claims, 10 Drawing Sheets

(51) Int. Cl.
   *H03H 1/00* (2006.01)
   *H01F 17/00* (2006.01)

(52) U.S. Cl.
   CPC ............... *H01F 2017/0026* (2013.01); *H03H 2001/0085* (2013.01); *H03H 2007/013* (2013.01)

(56) References Cited

U.S. PATENT DOCUMENTS

| | | | |
|---|---|---|---|
| 5,697,087 | A | 12/1997 | Miya et al. |
| 2002/0000874 | A1* | 1/2002 | Thomasson .......... H03H 11/126 327/552 |
| 2004/0246074 | A1 | 12/2004 | Humphrey |
| 2004/0251985 | A1 | 12/2004 | Guitton et al. |
| 2015/0028969 | A1* | 1/2015 | Watanabe ............ H03H 7/0115 333/185 |
| 2015/0188511 | A1* | 7/2015 | Ishizuka ................ H03H 7/38 343/860 |
| 2015/0222246 | A1* | 8/2015 | Nosaka ................ H03H 9/6483 333/187 |
| 2016/0028358 | A1 | 1/2016 | Yosui |

FOREIGN PATENT DOCUMENTS

| | | |
|---|---|---|
| JP | 02-224513 A | 9/1990 |
| JP | 06-224644 A | 8/1994 |
| JP | 2004-312741 A | 11/2004 |
| JP | 2004-343696 A | 12/2004 |
| JP | 2006-186621 A | 7/2006 |
| JP | 2012-238797 A | 12/2012 |
| WO | 2005/036741 A1 | 4/2005 |
| WO | 2014/185231 A1 | 11/2014 |

OTHER PUBLICATIONS

Official Communication issued in International Patent Application No. PCT/JP2016/061348, dated Jun. 28, 2016.

\* cited by examiner

RESONANT CIRCUIT, BAND ELIMINATION FILTER, AND BAND PASS FILTER

CROSS REFERENCE TO RELATED APPLICATIONS

This application claims the benefit of priority to Japanese Patent Application No. 2015-085166 filed on Apr. 17, 2015 and is a Continuation Application of PCT Application No. PCT/JP2016/061348 filed on Apr. 7, 2016. The entire contents of each application are hereby incorporated herein by reference.

BACKGROUND OF THE INVENTION

1. Field of the Invention

The present invention relates to a resonant circuit including an inductor and a capacitor, a band elimination filter including the resonant circuit, and a band pass filter including the resonant circuit.

2. Description of the Related Art

A band elimination filter or a band pass filter in the related art included in a high-frequency circuit includes an LC parallel resonant. For example, as illustrated in FIG. 14, an LC parallel circuit connected in series to a signal path and an LC series circuit connected in shunt between the signal path and the ground constitute a band elimination filter. As illustrated in FIG. 15, an LC series circuit connected in series to a signal path and an LC parallel circuit connected in shunt between the signal path and the ground constitute a band pass filter.

The band elimination filter illustrated in FIG. 14 is disclosed in, for example, Japanese Unexamined Patent Application Publication No. 2004-343696. A band pass filter illustrated in FIG. 15 is disclosed in, for example, Japanese Unexamined Patent Application Publication No. 63-18709.

In band elimination filters and band pass filters, in a case where steepness is required in a transient band between a stop band end and a pass band end, increasing the numbers of series-connected elements and shunt-connected elements is commonly effective. However, along with this, a problem arises in that an insertion loss increases.

As illustrated in FIGS. 14 and 15, in filters each including an LC resonant circuit, increasing the Q factor of the LC resonant circuit can increase steepness in a transient band. However, the direct-current resistance (DCR) of an inductor and the equivalent series resistance (ESR) of a capacitor are determined on the basis of the structures and conductive materials thereof. The Q factor of the LC resonant circuit cannot therefore be effectively increased.

SUMMARY OF THE INVENTION

Preferred embodiments of the present invention provide resonant circuits, band elimination filters, and band pass filters with which steepness is able to be effectively increased in a transient band.

A resonant circuit according to a preferred embodiment of the present invention includes a first inductor and a first capacitor which define a first series circuit and a second inductor connected in parallel to the first series circuit. The first inductor and the second inductor are coupled via a magnetic field in a direction in which magnetic fluxes passing through the first inductor and the second inductor strengthen each other.

Since the effective inductances of the first inductor and the second inductor are increased with the above-described configuration, the inductances of the first inductor and the second inductor are able to be reduced. This reduces the resistive component of a parallel resonant circuit and improves the Q factor of the parallel resonant circuit.

In a resonant circuit according to a preferred embodiment of the present invention, an inductance of the first inductor is preferably smaller than an inductance of the second inductor. This reduces or prevents an increase in a resistive component in the first series circuit and the attenuation of a signal passing through the first series circuit.

In a resonant circuit according to a preferred embodiment of the present invention, the first inductor preferably includes a first coil conductor and the second inductor preferably includes a second coil conductor. The first coil conductor and the second coil conductor are preferably integrally provided in a multilayer board in which a plurality of dielectric layers are laminated, preferably have the same or substantially the same inner and outer diameter dimensions, and preferably share a coil axis. As a result, a resonant circuit that is small in size, yet has a large mutual inductance generated by the coupling between the first inductor and the second inductor is provided.

A band elimination filter according to a preferred embodiment of the present invention includes a first port, a second port, and a first resonant circuit in which a first inductor and a first capacitor defining a first series circuit and a second inductor connected in parallel to the first series circuit are connected between the first port and the second port. The first inductor and the second inductor are coupled via a magnetic field in a direction in which magnetic fluxes passing through the first inductor and the second inductor strengthen each other.

Since the effective inductances of the first inductor and the second inductor are increased with the above-described configuration, the inductances of the first inductor and the second inductor are able to be reduced. This reduces the resistive component of a parallel resonant circuit and improves the Q factor of the parallel resonant circuit. Steepness in a transient band between a stop band end and a pass band end is therefore increased.

In a band elimination filter according to a preferred embodiment of the present invention, an inductance of the first inductor is preferably smaller than an inductance of the second inductor. This reduces or prevents an increase in a resistive component in the first series circuit and the attenuation of a signal passing through the first series circuit. That is, this reduces or prevents the increase in insertion loss in a pass band caused by the deposition of the first inductor.

In a band elimination filter according to a preferred embodiment of the present invention, a second resonant circuit that is connected between the first port and a ground and includes a third inductor is preferably further included. This provides a wide stop-band width.

In a band elimination filter according to a preferred embodiment of the present invention, the first inductor and the second inductor are preferably coupled to the third inductor. This reduces the resistive component of a resonant circuit and improves the Q factor of the resonant circuit. Steepness in a transient band between a stop band end and a pass band end is therefore increased.

In a band elimination filter according to a preferred embodiment of the present invention, the first inductor preferably includes a first coil conductor and the second inductor preferably includes a second coil conductor. The first coil conductor and the second coil conductor are preferably integrally provided in a multilayer board in which a plurality of dielectric layers are laminated, preferably have the same or substantially the same inner and outer diameter dimensions, and preferably share a coil axis. As a result, the first inductor and the second inductor have increased effective inductances for their small sizes. The effect of increasing steepness in a transient band is therefore improved.

A band pass filter according to a preferred embodiment of the present invention includes a first port, a second port, and a third resonant circuit in which a first inductor and a first capacitor defining a first series circuit and a second inductor connected in parallel to the first series circuit are connected between the first port and a ground. The first inductor and the second inductor are coupled via a magnetic field in a direction in which magnetic fluxes passing through the first inductor and the second inductor strengthen each other.

Since the effective inductances of the first inductor and the second inductor are increased with the above-described configuration, the inductances of the first inductor and the second inductor are able to be reduced. This reduces the resistive component of a parallel resonant circuit and improves the Q factor of the parallel resonant circuit. Steepness in a transient band between a stop band end and a pass band end is therefore increased.

In a band pass filter according to a preferred embodiment of the present invention, an inductance of the first inductor is preferably smaller than an inductance of the second inductor. This reduces or prevents an increase in a resistive component in the first series circuit. That is, this reduces or prevents the reduction in the amount of attenuation in an attenuation band caused by the deposition of the first inductor.

In a band pass filter according to a preferred embodiment of the present invention, a fourth resonant circuit that is connected between the first port and the second port and includes a fourth inductor is preferably further included. This provides a wide pass-band width.

In a band pass filter according to a preferred embodiment of the present invention, the first inductor and the second inductor are preferably coupled to the fourth inductor. This reduces the resistive component of a resonant circuit and improves the Q factor of the resonant circuit. Steepness in a transient band between a stop band end and a pass band end is therefore increased.

In a band pass filter according to a preferred embodiment of the present invention, the first inductor preferably includes a first coil conductor and the second inductor preferably includes a second coil conductor. The first coil conductor and the second coil conductor are preferably integrally provided in a multilayer board in which a plurality of dielectric layers are laminated, preferably have the same or substantially the same inner and outer diameter dimensions, and preferably share a coil axis. As a result, the first inductor and the second inductor have increased effective inductances for their small sizes. The effect of increasing steepness in a transient band is therefore enhanced.

According to various preferred embodiments of the present invention, resonant circuits having a high Q factor and band elimination filters and/or band pass filters having high steepness in a transient band between a stop band end and a pass band end are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
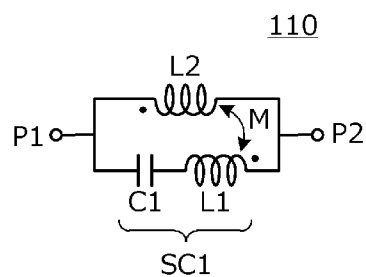
FIG. 1A is a circuit diagram of a resonant circuit 110 according to a first preferred embodiment of the present invention.

A plurality of preferred embodiments according to the present invention will be described below to provide concrete examples with reference to the drawings. The same elements and components are denoted by the same reference symbols in the drawings. While preferred embodiments are described separately for the sake of convenience and ease of explanation and understanding of key points, configurations described in the different preferred embodiments may be partially replaced or combined. In the second and subsequent preferred embodiments, descriptions of common elements, components, and configurations to those in the first preferred embodiment will be omitted and only different points will be described. In particular, descriptions of similar advantageous effects obtained with similar configurations will not be repeated in each of the preferred embodiments.

First Preferred Embodiment

In a first preferred embodiment of the present invention, a resonant circuit will be described.

FIG. 1A is a circuit diagram of a resonant circuit 110 according to the first preferred embodiment. The resonant circuit 110 includes a first inductor L1 and a first capacitor C1, which define a first series circuit SC1, and a second inductor L2 connected in parallel to the first series circuit SC1. This parallel connection is connected between ports P1 and P2.

The first inductor L1 and the second inductor L2 are coupled via a magnetic field in a direction in which magnetic fluxes passing through the first inductor L1 and the second inductor L2 strengthen each other. As illustrated in FIG. 1A, the coupling between the first inductor L1 and the second inductor L2 generate a mutual inductance M.

Figure 1B:
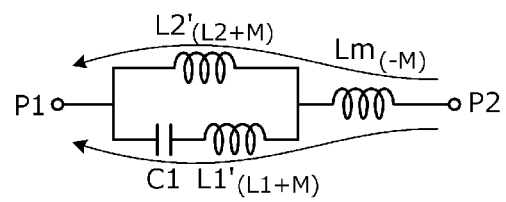
FIG. 1B is an equivalent circuit diagram of the resonant circuit 110.

FIG. 1B is an equivalent circuit diagram of the resonant circuit 110. Inductors L1', L2', and Lm illustrated in FIG. 1B are inductors obtained by equivalently transforming the first inductor L1, the second inductor L2, and the mutual inductance M illustrated in FIG. 1A into a T-type circuit. In a case where the inductance of the first inductor L1 is represented by L1, the inductance of the second inductor L2 is represented by L2, and the mutual inductance is represented by M, the inductance of the inductor L1' is (L1+M), the inductance of the inductor L2' is (L2+M), and the inductance of the inductor Lm is (−M). Thus, the coupling between the first inductor L1 and the second inductor L2 increases the effective inductances of the first inductor L1 and the second inductor L2. The inductances of the first inductor L1 and the second inductor L2 are therefore able to be reduced. Along with this, a resistive component (direct-current resistance DCR) is reduced, the resistive component of a parallel resonant circuit is reduced, and the Q factor of the parallel resonant circuit is improved.

Connecting the first inductor L1 in series to the first capacitor C1 increases the amount of change in reactance of the first series circuit SC1 with respect to a frequency. The first capacitor C1 is therefore able to be reduced in value and is able to be easily created at the time of being integrated in a layered structure. That is, the reactance of the first capacitor C1 is represented by $-1/\omega C$ and a reactance obtained by connecting the first inductor L1 having a small inductance in series to the first capacitor C1 is $\omega L1 - 1/\omega C1$. Thus, a reactance is increased. This effect is similar to an effect obtained in a case where the value of C1, $-1/\omega C1$, is increased to increase a reactance. This is roughly equivalent to the increase in real capacitance value. The capacitance of the first capacitor C1 is therefore able to be reduced.

The inductance of the first inductor L1 is preferably smaller than the inductance of the second inductor L2. This reduces or prevents the increase in resistive component in the first series circuit SC1 and the attenuation of a signal passing through the first series circuit SC1.

Figure 2:
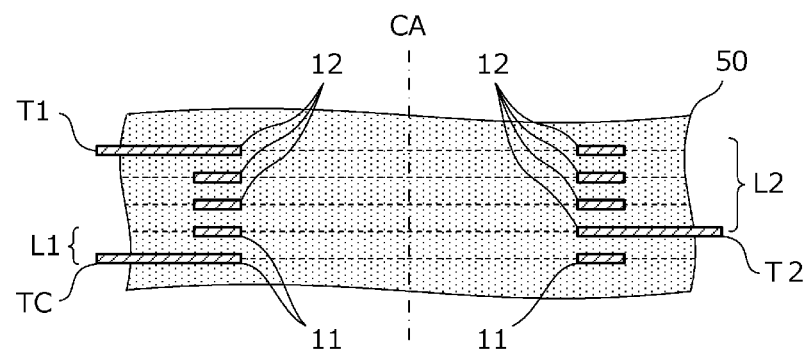
FIG. 2 is a cross-sectional view of a main portion of the resonant circuit 110.

FIG. 2 is a cross-sectional view of a main portion of the resonant circuit 110. The first inductor L1 includes a first coil conductor 11. The second inductor L2 includes a second coil conductor 12. Each of the first coil conductor 11 and the second coil conductor 12 includes conductor patterns provided in a plurality of dielectric layers and interlayer connection conductors. These dielectric layers are laminated to provide a multilayer board 50. That is, the first inductor L1 and the second inductor L2 are integrally provided in the multilayer board 50. Each of the first coil conductor 11 and the second coil conductor 12 preferably has a rectangular or substantially rectangular helical shape. The first coil conductor 11 and the second coil conductor 12 preferably share a coil axis CA and have the same or substantially the same inner and outer diameter dimensions.

FIG. 2 illustrates regions where the first inductor L1 and the second inductor L2 are provided. One end portion Tc of the first coil conductor 11 is electrically connected to an electrode of the first capacitor C1. A first end T1 of the second coil conductor 12 is electrically connected to a first port P1. A second end T2 of the second coil conductor 12 is electrically connected to a second port P2.

As described above, the first coil conductor 11 and the second coil conductor 12 preferably share the coil axis CA and have the same or substantially the same inner and outer diameter dimensions. Accordingly, a resonant circuit is provided that is small in size, yet has the large mutual inductance M generated by the coupling between the first inductor L1 and the second inductor L2.

The first capacitor C1 may be embedded in the multilayer board 50 or mounted (surface mounted) on the multilayer board 50.

Second Preferred Embodiment

In a second preferred embodiment of the present invention, exemplary band elimination filters will be described.

Figure 3:
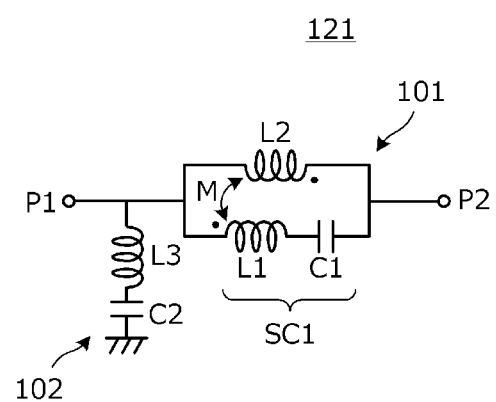
FIG. 3 is a circuit diagram of a band elimination filter 121 according to a second preferred embodiment of the present invention.

FIG. 3 is a circuit diagram of a band elimination filter 121 according to the second preferred embodiment. The band elimination filter 121 includes a first port P1 and a second port P2, and includes a first resonant circuit 101 connected between the first port P1 and the second port P2. The band elimination filter 121 further includes a second resonant circuit 102 that is connected between the first port P1 and the ground and is a series circuit including a third inductor L3 and a second capacitor C2.

The first resonant circuit 101 has the same or substantially the same configuration as the resonant circuit 110 according to the first preferred embodiment.

With the above-described configuration, the coupling between the first inductor L1 and the second inductor L2 increases the effective inductances of the first inductor L1 and the second inductor L2. The inductances of the first inductor L1 and the second inductor L2 are therefore able to be reduced. Along with this, a resistive component (direct-current resistance DCR) is reduced, the resistive component of a parallel resonant circuit is reduced, and the Q factor of the parallel resonant circuit is improved. Accordingly, steepness is increased in a transient band between a stop band end and a pass band end.

Since the second resonant circuit that is the series circuit including the third inductor L3 and the second capacitor C2 is further provided between the first port P1 and the ground in the band elimination filter 121, a wide stop-band width is able to be provided.

Figure 4A:
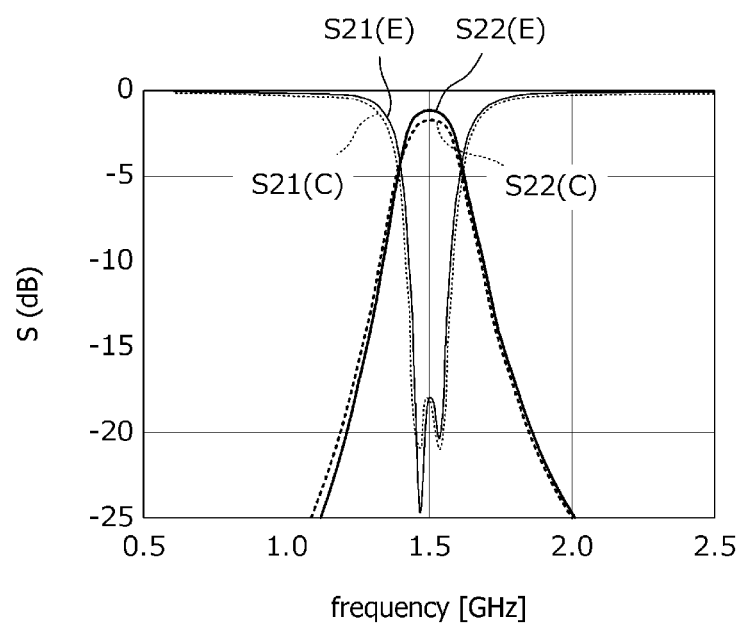
FIG. 4A is a diagram illustrating bandpass characteristics and reflection characteristics of the band elimination filter 121.

FIG. 4A is a diagram illustrating bandpass characteristics and reflection characteristics of the band elimination filter 121. In the drawing, S21(E) represents the insertion loss of the band elimination filter 121 according to the present preferred embodiment using the S parameter S21, S22(E) represents the return loss of the band elimination filter 121 according to the present preferred embodiment using the S parameter S22, S21(C) represents the insertion loss of a band elimination filter that is a comparative example using the S parameter S21, and S22(C) represents the return loss of the band elimination filter that is a comparative example using the S parameter S22.

Values of respective elements of the band elimination filter 121 are as follows.

L1: about 0.8 nH
L2: about 1.1 nH
L3: about 29 nH
C1: about 3.5 pF
C2: about 0.4 pF
Coupling coefficient k: about 0.8

A band elimination filter that is a comparative example has the following values, L1: 0 nH and C1: about 10.9 pF.

Figure 4B:
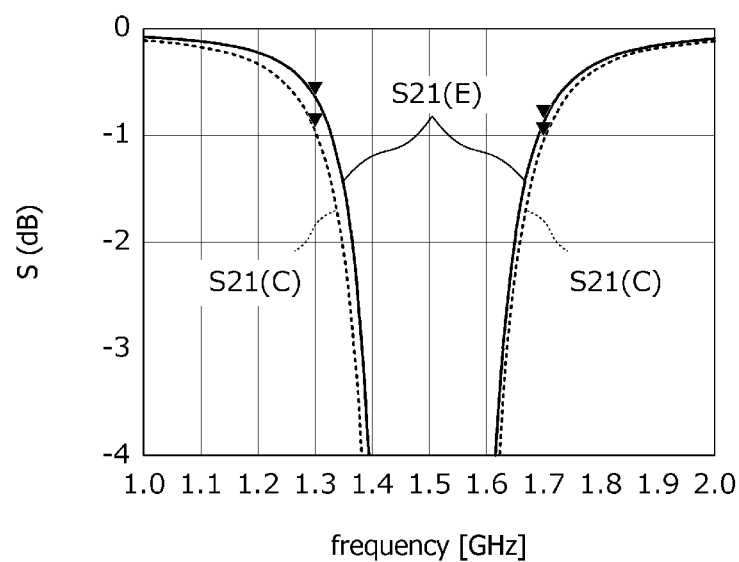
FIG. 4B is an enlarged view of a transient band between a stop band and a pass band illustrated in FIG. 4A.

FIG. 4B is an enlarged view of a transient band between a stop band and a pass band illustrated in FIG. 4A and illustrates S21(E) and S21(C).

The band elimination filter 121 according to the present preferred embodiment and a band elimination filter that is a comparative example are designed to have a stop band with a bandwidth of about ±50 MHz centered at about 1.5 GHz and a pass band spaced away from the center frequency by about 150 MHz or greater. They were designed such that S21 was less than or equal to about −18 dB in the stop band and was the maximum in the pass band, and were compared with each other.

As is apparent from FIGS. 4A and 4B, in the band elimination filter 121 according to the present preferred embodiment, S21 was improved in the pass band by approximately 0.2 dB.

Figure 5:
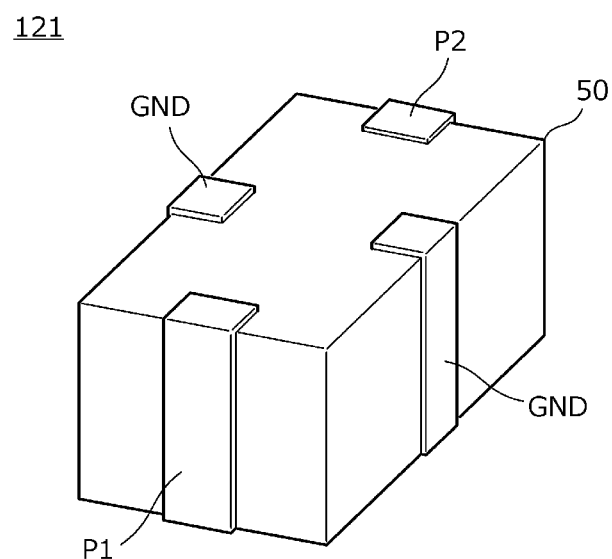
FIG. 5 is an external perspective view of the band elimination filter 121 according to the second preferred embodiment of the present invention.

FIG. 5 is an external perspective view of the band elimination filter 121 according to the present preferred embodiment. The band elimination filter 121 includes a first port (terminal) P1, a second port (terminal) P2, and a ground terminal GND. The first resonant circuit 101 and the second resonant circuit 102 illustrated in FIG. 3 are integrally provided in the multilayer board 50 in which a plurality of dielectric layers are laminated. The first coil conductor and the second coil conductor preferably have the same or substantially the same inner and outer diameter dimensions and share a coil axis. The third inductor L3 included in the second resonant circuit 102 is also provided in the multilayer board 50. The first capacitor C1 and the second capacitor C2 also include conductor patterns in the multilayer board 50. The first capacitor C1 and the second capacitor C2 may preferably be mounted (surface mounted) on the multilayer board 50.

Figure 6:
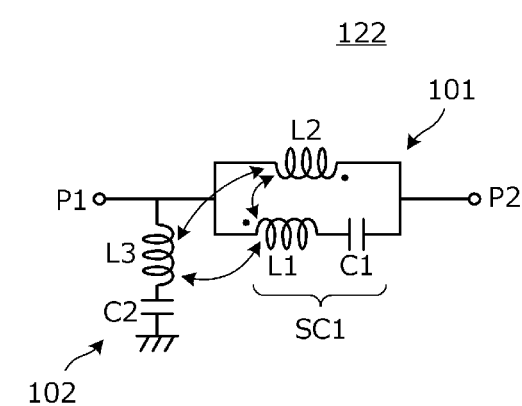
FIG. 6 is a circuit diagram of a band elimination filter 122 according to a preferred embodiment of the present invention.

FIG. 6 is a circuit diagram of a band elimination filter 122 according to a preferred embodiment of the present invention. The band elimination filter 122 includes a first port P1 and a second port P2 and includes the first resonant circuit 101 and the second resonant circuit 102. Unlike in the band elimination filter 121 illustrated in FIG. 3, the third inductor L3 is coupled to the first inductor L1 and the second inductor L2. As a result, the resistive component of a resonant circuit is reduced, a Q factor of the resonant circuit is improved, and steepness in a transient band between a stop band end and a pass band end is increased.

Figure 7:
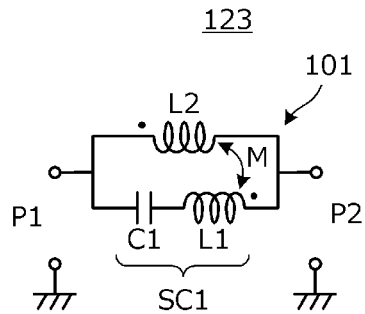
FIG. 7 is a circuit diagram of a band elimination filter 123 according to a preferred embodiment of the present invention.

FIG. 7 is a circuit diagram of a band elimination filter 123 according to a preferred embodiment of the present invention. The band elimination filter 123 includes a first port P1 and a second port P2 and includes the first resonant circuit 101 connected in series between them. The first resonant circuit 101 has the same or substantially the same configuration as the resonant circuit 110 according to the first preferred embodiment. In a case where a stop-band width is narrow, a band elimination filter may include only a single-stage LC parallel resonant circuit similar to FIG. 7.

Figure 8A:
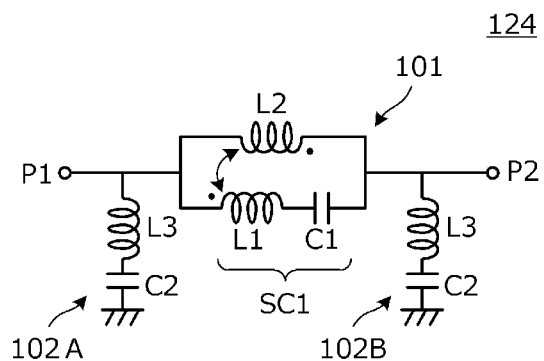
FIG. 8A is a circuit diagram of a band elimination filter 124 according to a preferred embodiment of the present invention.
Figure 8B:
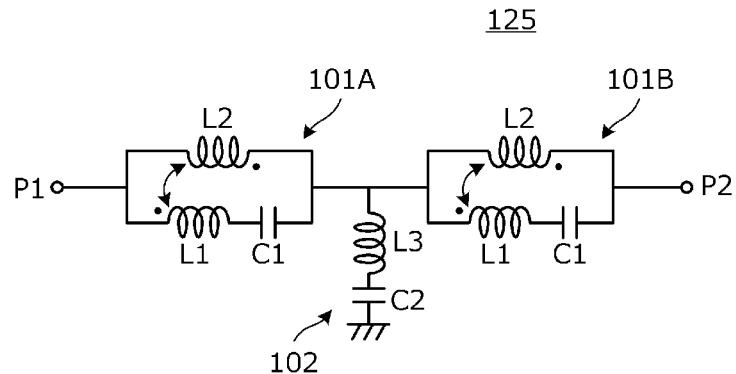
FIG. 8B is a circuit diagram of a band elimination filter 125 according to a preferred embodiment of the present invention.

FIG. 8A is a circuit diagram of a band elimination filter 124 according to a preferred embodiment of the present invention, and FIG. 8B is a circuit diagram of a band elimination filter 125 according to another preferred embodiment of the present invention. The band elimination filter 124 includes a first port P1 and a second port P2 and includes the first resonant circuit 101 and two second resonant circuits 102A and 102B which are connected in a π shape. The band elimination filter 125 includes a first port P1 and a second port P2 and includes two first resonant circuits 101A and 101B and the second resonant circuit 102 which are connected in a T shape.

Three or more resonant circuits may be connected in multiple stages as shown in FIGS. 8A and 8B on the condition that an insertion loss falls within tolerances in a pass band.

Third Preferred Embodiment

In a third preferred embodiment of the present invention, some exemplary band pass filters will be described.

Figure 9:
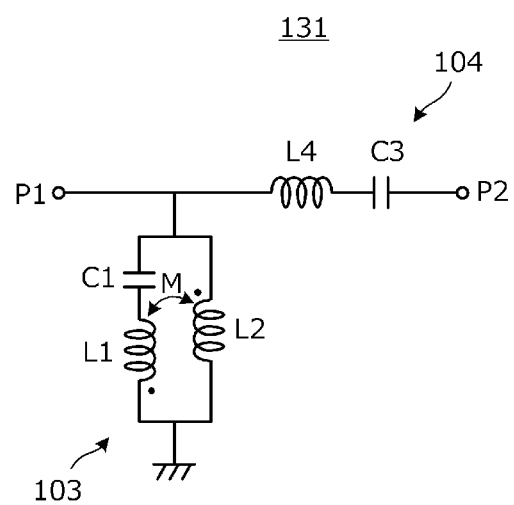
FIG. 9 is a circuit diagram of a band pass filter 131 according to a third preferred embodiment of the present invention.

FIG. 9 is a circuit diagram of a band pass filter 131 according to the third preferred embodiment. The band pass filter 131 includes a first port P1 and a second port P2 and includes a third resonant circuit 103 connected in shunt with the first port P1 and a fourth resonant circuit 104 connected in series between the first port P1 and the second port P2.

The third resonant circuit 103 has the same or substantially the same configuration as the resonant circuit 110 according to the first preferred embodiment. The fourth resonant circuit 104 includes a series circuit including a fourth inductor L4 and a third capacitor C3.

Figure 10A:
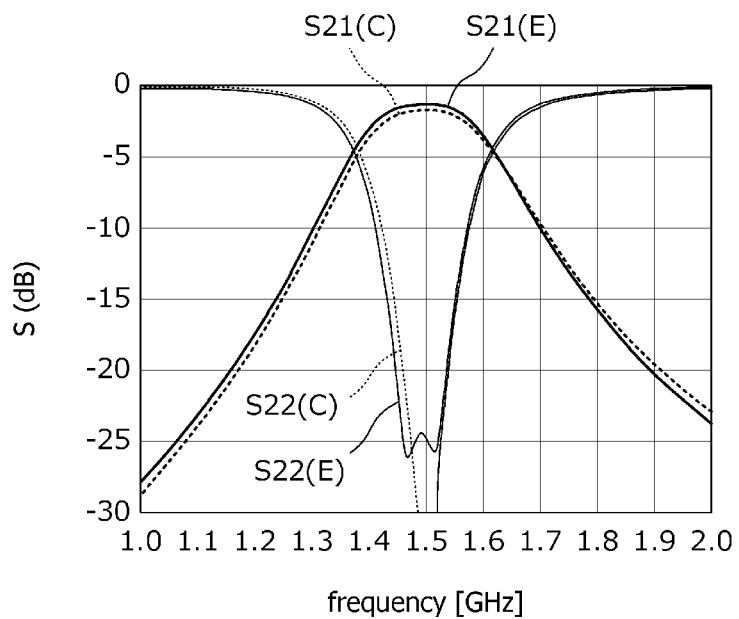
FIG. 10A is a diagram illustrating bandpass characteristics and reflection characteristics of the band pass filter 131.

FIG. 10A is a diagram illustrating bandpass characteristics and reflection characteristics of the band pass filter 131. In FIG. 10A, S21(E) represents the insertion loss of the band elimination filter 131 according to the present preferred embodiment using the S parameter S21, S22(E) represents the return loss of the band elimination filter 131 according to the present preferred embodiment using the S parameter S22, S21(C) represents the insertion loss of a band elimination filter that is a comparative example using the S parameter S21, and S22(C) represents the return loss of the band elimination filter that is a comparative example using the S parameter S22.

Values of respective elements of the band elimination filter 131 are as follows.

L1: about 1.2 nH
L2: about 0.6 nH
L4: about 40 nH
C1: about 0.3 pF
C3: about 5.2 pF
Coupling coefficient k: about 0.8

A band elimination filter that is a comparative example has the following values, L1: 0 nH and C3: about 18.8 pF.

Figure 10B:
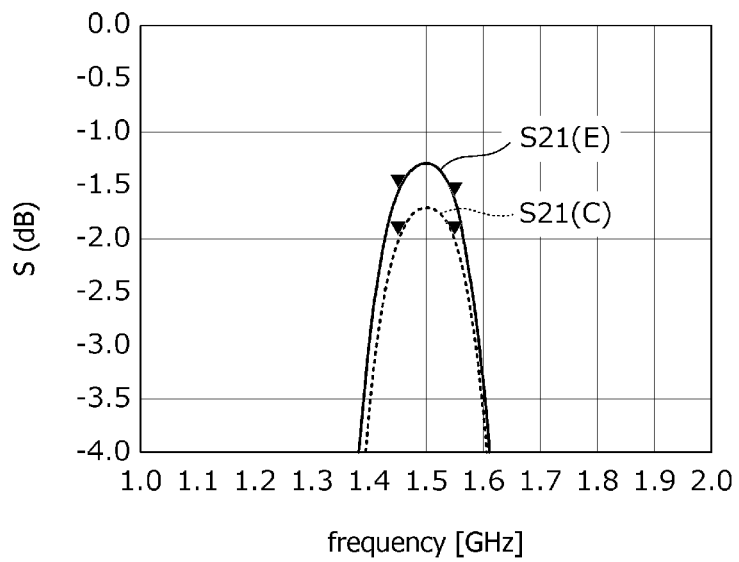
FIG. 10B is an enlarged view of a transient band between a stop band and a pass band illustrated in FIG. 10A.

FIG. 10B is an enlarged view of a transient band between a stop band and a pass band illustrated in FIG. 10A and illustrates S21(E) and S21(C).

The band elimination filter 131 according to the present preferred embodiment and a band elimination filter that is a comparative example are designed to have a pass band with a bandwidth of about ±50 MHz centered at about 1.5 GHz and a stop band spaced away from the center frequency by about 150 MHz or greater. They were designed such that S21 was less than or equal to about −10 dB in the stop band and was the maximum in the pass band, and were compared with each other.

As is apparent from FIGS. 10A and 10B, in the band elimination filter 131 according to the present preferred embodiment, S21 was improved in the pass band by approximately 0.4 dB.

Figure 11:
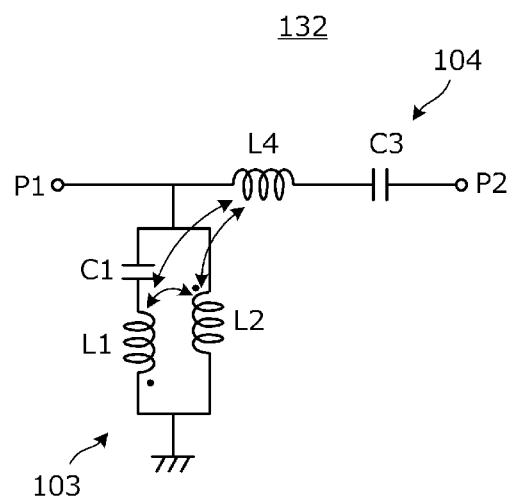
FIG. 11 is a circuit diagram of a band pass filter 132 according to a preferred embodiment of the present invention.

FIG. 11 is a circuit diagram of a band pass filter 132 according to a preferred embodiment of the present invention. The band pass filter 132 includes a first port P1 and a second port P2 and includes the third resonant circuit 103 and the fourth resonant circuit 104. Unlike in the band pass filter 131 illustrated in FIG. 9, the fourth inductor L4 is coupled to the first inductor L1 and the second inductor L2. As a result, the resistive component of a resonant circuit is reduced, a Q factor of the resonant circuit is improved, and steepness is increased in a transient band between a stop band end and a pass band end.

Figure 12:
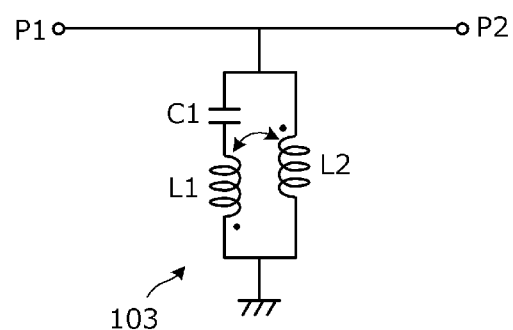
FIG. 12 is a circuit diagram of a band pass filter 133 according to a preferred embodiment of the present invention.

FIG. 12 is a circuit diagram of a band pass filter 133 according to a preferred embodiment of the present invention. The band pass filter 133 includes a first port P1 and a second port P2 and includes the third resonant circuit 103 connected in shut between them. The third resonant circuit 103 has the same or substantially the same configuration as the resonant circuit 110 according to the first preferred embodiment. In a case where a pass-band width is narrow, a band pass filter may preferably include only a single-stage LC parallel resonant circuit as shown in FIG. 12.

Figure 13A:
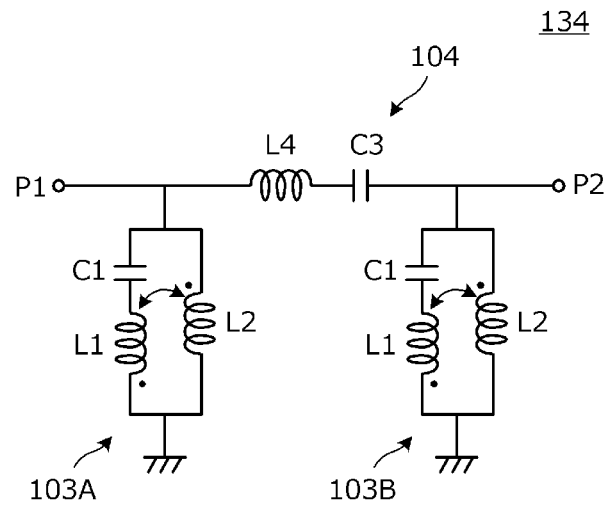
FIG. 13A is a circuit diagram of a band pass filter 134 according to a preferred embodiment of the present invention.
Figure 13B:
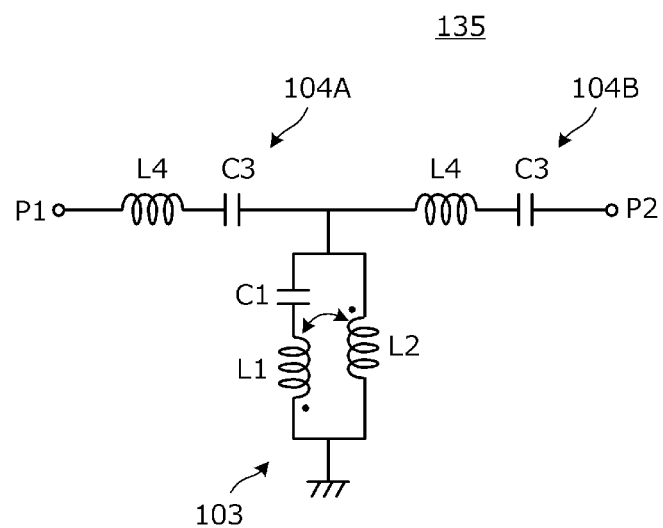
FIG. 13B is a circuit diagram of a band pass filter 135 according to a preferred embodiment of the present invention.
Figure 14:
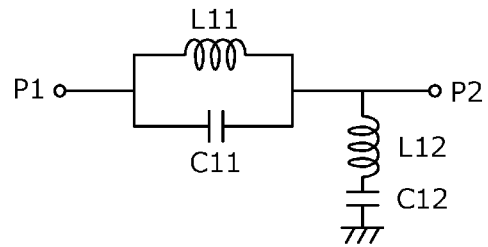
FIG. 14 is a circuit diagram illustrating an exemplary configuration of a band elimination filter in the related art.
Figure 15:
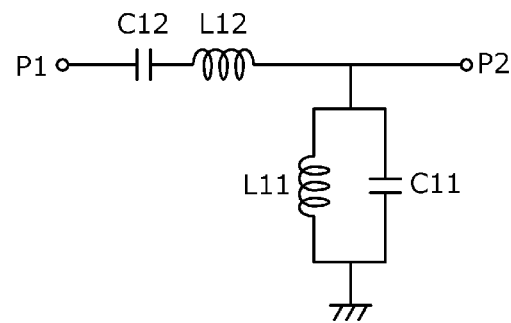
FIG. 15 is a circuit diagram illustrating an exemplary configuration of a band pass filter in the related art.

FIG. 13A is a circuit diagram of a band pass filter 134 according to a preferred embodiment of the present invention, and FIG. 13B is a circuit diagram of a band pass filter 135 according to another preferred embodiment of the present invention. The band elimination filter 134 includes a first port P1 and a second port P2 and includes two third resonant circuits 103A and 103B and the fourth resonant circuit 104 which are connected in a π shape. The band elimination filter 135 includes a first port P1 and a second port P2 and includes the third resonant circuit 103 and two fourth resonant circuits 104A and 104B which are connected in a T shape.

Three or more resonant circuits may be connected in multiple stages as shown in FIGS. 13A and 13B on the condition that an insertion loss falls within tolerances in a pass band.

In the above-described preferred embodiments, the first capacitor C1, the second capacitor C2, and the third capacitor C3 may be integrally provided inside/outside a multilayer board, or may be disposed on a printed wiring board as separate components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A band elimination filter comprising:
a first port;
a second port; and
a first resonant circuit in which a first inductor and a first capacitor defining a first series circuit and a second inductor connected in parallel to the first series circuit are connected between the first port and the second port; wherein
the first inductor and the second inductor are coupled via a magnetic field in a direction in which magnetic fluxes passing through the first inductor and the second inductor strengthen each other;
the first inductor includes a first coil conductor and the second inductor includes a second coil conductor;
the first coil conductor and the second coil conductor are integrally provided in a multilayer board in which a plurality of dielectric layers are laminated, have same or substantially same inner and outer diameter dimensions, and share a coil axis; and
the first coil conductor includes first conductor patterns provided over a first plurality of the dielectric layers, and the second coil conductor includes second conductor patterns provided over a second plurality of the dielectric layers; and a second resonant circuit is provided in the multilayer board and includes a third inductor and a second capacitor.

2. The band elimination filter according to claim 1, wherein the second resonant circuit is connected between the first port and a ground.

3. The band elimination filter according to claim 2, wherein the first inductor and the second inductor are coupled to the third inductor.

4. The band elimination filter according to claim 1, wherein each of the first coil conductor and the second coil conductor further includes interlayer connection conductors.

5. The band elimination filter according to claim 1, wherein each of the first coil conductor and the second coil conductor has a rectangular or substantially rectangular helical shape.

6. The band elimination filter according to claim 1, wherein an inductance of the first inductor is smaller than an inductance of the second inductor.

7. A band pass filter comprising:
a first port;
a second port; and
a third resonant circuit in which a first inductor and a first capacitor defining a first series circuit and a second inductor connected in parallel to the first series circuit are connected between the first port and a ground; wherein
the first inductor and the second inductor are coupled via a magnetic field in a direction in which magnetic fluxes passing through the first inductor and the second inductor strengthen each other;
the first inductor includes a first coil conductor and the second inductor includes a second coil conductor;
the first coil conductor and the second coil conductor are integrally provided in a multilayer board in which a plurality of dielectric layers are laminated, have same or substantially same inner and outer diameter dimensions, and share a coil axis; and
the first coil conductor includes first conductor patterns provided over a first plurality of the dielectric layers, and the second coil conductor includes second conductor patterns provided over a second plurality of the dielectric layers; and a fourth resonant circuit is provided in the multilayer board and includes a fourth inductor and a second capacitor.

8. The band pass filter according to claim 7, wherein the fourth resonant circuit is connected between the first port and the second port.

9. The band pass filter according to claim 8, wherein the first inductor and the second inductor are coupled to the fourth inductor.

10. The band pass filter according to claim 7, wherein each of the first coil conductor and the second coil conductor further includes interlayer connection conductors.

11. The band pass filter according to claim 7, wherein each of the first coil conductor and the second coil conductor has a rectangular or substantially rectangular helical shape.

12. The band pass filter according to claim 7, wherein an inductance of the first inductor is smaller than an inductance of the second inductor.

* * * * *